United States Patent
Zhang (10) Patent No.: US 9,136,179 B2
(45) Date of Patent: Sep. 15, 2015

(54) HIGH GAIN DEVICE

(71) Applicant: GLOBALFOUNDARIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/655,431

(22) Filed: Oct. 18, 2012

(65) Prior Publication Data

US 2014/0110783 A1  Apr. 24, 2014

(51) Int. Cl.
*H01L 21/02* (2006.01)
*H01L 21/8238* (2006.01)

(52) U.S. Cl.
CPC .............................. *H01L 21/823814* (2013.01)

(58) Field of Classification Search
CPC .............................................. H01L 21/823814
USPC .......... 257/392, 408, 345, 369, 900; 438/275, 438/303
See application file for complete search history.

(56) References Cited

U.S. PATENT DOCUMENTS

| | | | | |
|---|---|---|---|---|
| 5,212,542 A | * | 5/1993 | Okumura | 257/369 |
| 5,517,049 A | * | 5/1996 | Huang | 257/357 |
| 6,040,222 A | * | 3/2000 | Hsu et al. | 438/301 |
| 6,157,062 A | * | 12/2000 | Vasanth et al. | 257/336 |
| 6,476,430 B1 | * | 11/2002 | Schmitz et al. | 257/274 |
| 6,617,214 B2 | * | 9/2003 | Yeap et al. | 438/283 |
| 6,803,283 B1 | * | 10/2004 | Chen | 438/275 |

* cited by examiner

*Primary Examiner* — Mark Prenty
(74) *Attorney, Agent, or Firm* — Horizon IP Pte. Ltd.

(57) ABSTRACT

A method of forming a device is disclosed. A substrate having a high gain (HG) device region for a HG transistor is provided. A HG gate is formed on the substrate in the HG device region. The HG gate includes sidewall spacers on its sidewalls. Heavily doped regions are formed adjacent to the HG gate. Inner edges of the heavily doped regions are aligned with about outer edges of the sidewall spacers of the HG gate. The heavily doped regions serve as HG source/drain (S/D) regions of the HG gate. The HG S/D regions do not include lightly doped drain (LDD) regions or halo regions.

16 Claims, 8 Drawing Sheets

HIGH GAIN DEVICE

BACKGROUND

Complementary Metal Oxide Semiconductor (CMOS) transistors have been widely employed. For example, CMOS transistors have been employed for analog applications. Analog applications employ CMOS transistors with high gains. However, as CMOS technology migrates into the nano-regime, it has been found that gains of CMOS transistors become reduced, affecting its effectiveness.

The present disclosure relates to providing high gain transistors in the nanotechnology regime.

SUMMARY

Embodiments generally relate to semiconductor devices or integrated circuits (ICs). In one embodiment, a method of forming a device is disclosed. A substrate having a high gain (HG) device region for a HG transistor is provided. A HG gate is formed on the substrate in the HG device region. The HG gate includes sidewall spacers on its sidewalls. Heavily doped regions are formed adjacent to the HG gate. Inner edges of the heavily doped regions are aligned with about outer edges of the sidewall spacers of the HG gate. The heavily doped regions serve as HG source/drain (S/D) regions of the HG gate. The HG S/D regions do not include lightly doped drain (LDD) regions or halo regions.

In another embodiment, a method of forming a device is presented. The method includes providing a substrate having at least a first device region for a first transistor and a second device region for a second transistor. A first gate is formed on the first device region and a second gate is formed on the second device region. The gates include sidewall spacers on their sidewalls. Heavily doped regions are formed adjacent to the gates. Inner edges of the heavily doped regions are aligned with about outer edges of the sidewall spacers of the gates. The heavily doped regions serve as source/drain (S/D) regions of the gates. The S/D regions of the second transistor do not include lightly doped drain (LDD) regions or halo regions.

In yet another embodiment, a device is disclosed. The device includes a substrate having a high gain (HG) device region for a HG transistor. A HG gate is disposed on the substrate in the HG device region. The HG gate includes sidewall spacers on its sidewalls. Heavily doped regions are disposed adjacent to the HG gate. Inner edges of the heavily doped regions are aligned with about outer edges of the sidewall spacers of the HG gate. The heavily doped regions serve as HG source/drain (S/D) regions of the HG gate. The HG S/D regions do not include lightly doped drain (LDD) regions or halo regions.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to high gain devices. For example, high gain devices include transistors, such as metal oxide transistors (MOS). The high gain devices can be employed in analog applications, such as high DC gain amplifier, audio amplifier or audio Codex. The high gain transistors can be easily integrated into devices or ICs with core or digital devices. The devices or ICs can be incorporated into or used with, for example, consumer electronic products, and particularly portable consumer products such as, for example, mobile phones, tablets, and PDAs.

Figure 1:
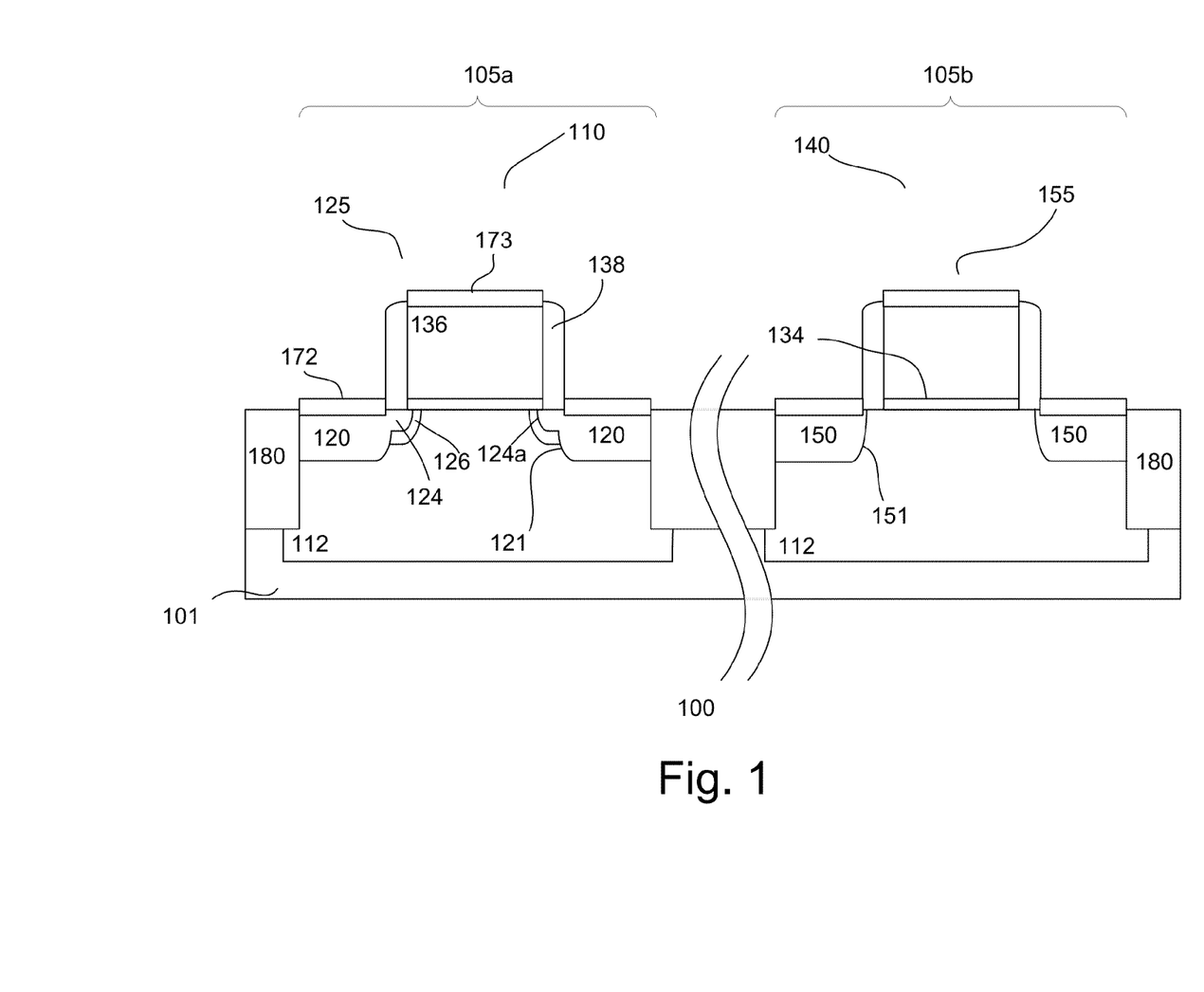
FIG. 1 shows cross-sectional view of a portion of an embodiment of a device.

FIG. 1 shows a cross-sectional view of a portion of an embodiment of a device 100. The device, for example, is an IC. Other types of devices may also be useful. As shown, the device includes a substrate 101. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$–$1E13/cm^2$, and an intermediately doped region may have a dopant concentration of about $1E13$–$1E15/cm^2$, and a heavily doped region may have a dopant concentration of about $1E15$–$1E17/cm^2$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

The substrate includes first and second device regions 105a-b for first and second transistors 110 and 140. In one embodiment, the first device region is for a core transistor and the second device region is for a high gain (HG) transistor. The first device region may be disposed in a core or logic device region of the substrate and the second device region may be disposed in an analog or HG device region. The substrate may also include regions for other types of circuitry, depending on the type of device or IC. For example, the device may also include regions for intermediate voltage (IV) and high voltage (HV) devices as well as an array region for memory devices. In other embodiments, the first device region may include a HV or IV device. Other configurations of first and second device regions may also be useful.

Isolation regions may be provided for isolating or separating different regions of the substrate. In one embodiment, the device regions are isolated from other regions by isolation regions 180. For example, an isolation region surrounds a device region. The isolation regions, for example, are shallow trench isolation (STI) regions. Other types of isolation regions may also be employed. For example, the isolation regions may be deep trench isolation (DTI) regions. The STI regions, for example, extend to a depth of about 2000-5000 Å. Providing isolation regions which extend to other depths may also be useful.

A device well 112 may be disposed in a device region. In one embodiment, device wells are provided for first and second device regions. A device well is disposed within the isolation region. A depth of the device wells may be about 0.5-5 µm. Other depths for the device wells may also be useful. In one embodiment, the device wells are doped with second polarity type dopants. For example, the device wells are doped with p-type dopants. Alternatively, the second polarity type dopants may be n-type. The device wells serve as bodies of the transistors. For example, the device well in the first device region serves as a body of the first transistor and the device well in the second device region serves as a body of the second transistor. The dopant concentration of the device wells may be light to intermediate. For example, the dopant concentration of the device wells may be about 5E12-5E13/cm$^2$. Other dopant concentration for the device wells may also be useful.

The first transistor includes a first gate 125 on the surface of the substrate; the second transistor includes a second gate 155 on the surface of the substrate. A gate, for example, includes a gate electrode 136 over a gate dielectric 134. The gate electrode, for example, may be polysilicon. The gate electrode may be about 700-5000 Å thick. Other types of gate electrodes as well as thicknesses may also be useful. As for the gate dielectric, it may be formed of silicon oxide. The thickness of the gate dielectric may be, for example, about 10-40 Å. Other types of gate dielectrics or thicknesses may also be useful.

As shown, the thickness of the gate dielectrics for the transistors is the same. For example, the first transistor is a core transistor. In other embodiments, the transistors may have gate dielectrics of different thicknesses. For example, in the case where the first transistor is an IV or a HV transistor, the transistors may have different gate dielectric thicknesses.

Dielectric sidewall spacers 138 are disposed on sidewalls of the gate. The sidewall spacers, for example, may be silicon oxide. Other types of dielectric materials or combination of materials may be used for the spacers. It is understood that the first and second gates need not be the same type of gates. For example, the various components of the first and second gates may be formed of different materials or have different configurations.

A length of a channel of a transistor is equal to the width of the gate. For example, the channel length of a transistor is equal to the width of the gate between its sidewalls. In one embodiment, the first transistor has a gate width equal to a minimum feature size F. In one embodiment, F is in the nano technology regime. In one embodiment, F is less than 0.18 µm or 180 nm. In another embodiment, F is 0.13 µm or less. Providing other dimensions for F may also be useful. It is understood that the first and second gates need not be of the same width. It is further understood that a device may have different transistors with different gate widths. For example, the channel length of the HG transistor is greater than F. In one embodiment, the channel length of the HG transistor may be about 1 µm or longer. The longer the channel length, the higher the output resistance for the HG transistor. Providing other channel lengths may also be useful, for example, depending on design requirements. The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The first transistor includes first doped regions 120 disposed in the substrate adjacent to the sides of the first gate. For example, a first doped region is disposed adjacent to about an outer edge of the dielectric sidewall spacer of the first gate and another first doped region is disposed adjacent to about an outer edge of the other dielectric sidewall spacer of the first gate. The doped regions, for example, are from the isolation regions to about the sides of the first gate. In one embodiment, inner edges 121 of the doped regions are aligned with about outer edges of the dielectric sidewall spacers of the first gate. The doped regions, in one embodiment, are heavily doped with first polarity type dopants for a first type transistor. For example, the doped regions are heavily doped n-type (n$^+$) regions for a n-type transistor. Providing heavily doped p-type (p$^+$) regions may also be useful for a p-type transistor. The heavily doped regions, for example, have a dopant concentration of about 1E15-1E17/cm$^2$. Other dopant concentrations for the doped regions may also be useful. The depth of the doped regions may be about 0.1-0.4 µm. Providing doped regions having other depths may also be useful. Additionally, it is not necessary that the first doped regions have the same depth. The doped regions serve as source/drain (S/D) regions of the transistor.

In one embodiment, the first transistor includes lightly doped drain (LDD) regions 124. As shown in FIG. 1, inner edges 124a of the LDD regions adjacent to the sides of the gate are aligned with about sidewalls of the first gate. In one embodiment, the LDD region 124 extends from the first doped regions to underlap the gate. The LDD regions should underlap the gate sufficiently so that the S/D regions are in communication with the channel under the gate. The underlap portion may be, for example, about 0.004-0.04 µm. Providing an underlap portion which underlaps the gate by other amounts may also be useful. The LDD regions, in one embodiment, are lightly doped with first polarity type dopants for a first type transistor. For example, the doped regions are lightly doped n-type (n$^-$) regions for a n-type transistor. Providing lightly doped p-type (p$^-$) regions may also be useful for a p-type transistor. The LDD regions, for example, have a dopant concentration of about 5E13-5E15/cm$^2$. Other dopant concentrations for the doped regions may also be useful. The depth of the LDD regions may be about 0.05-0.3 µm. Providing LDD regions having other depths may also be useful.

Halo regions 126, in one embodiment, are provided in the substrate. A halo region, for example, extends under the gate beyond the LDD regions. The halo regions, for example, extend under the gate beyond the LDD regions and above the first doped regions. The underlap portion may be, for example, about 0.002-0.02 µm. Providing an underlap portion which underlaps the gate by other amounts may also be useful. In one embodiment, the halo regions may be intermediately or heavily doped with second polarity type dopants. The halo regions, for example, may have a dopant concentration of about 5E13-5E14/cm$^2$. Other dopant concentrations for the halo regions may also be useful.

As described, the second transistor is a HG transistor. The channel length of the second transistor, for example, may be at least about 0.5 µm. Other channel length dimensions for the HG transistor may also be useful. The second transistor includes second doped regions 150 disposed in the substrate adjacent to the sides of the second gate. For example, a second doped region is disposed adjacent to about an outer edge of the dielectric sidewall spacer of the second gate and another second doped region is disposed adjacent to about an outer edge of the other dielectric sidewall spacer of the second gate. The second doped regions, for example, are from the isolation regions to about the sides of the second gate. In one embodiment, inner edges 151 of the second doped regions are aligned with about outer edges of the dielectric sidewall spacers of the second gate. The second doped regions, in one embodiment, are heavily doped with first polarity type dopants for a first type transistor. For example, the second doped regions are heavily doped n-type ($n^+$) regions for a n-type transistor. Providing heavily doped p-type ($p^+$) regions may also be useful for a p-type transistor. The heavily doped regions, for example, have a dopant concentration of about 1E15-1E17/$cm^2$. Other dopant concentrations for the doped regions may also be useful. The depth of the second doped regions may be about 0.1-0.4 μm. Providing doped regions having other depths may also be useful. The first and second doped regions need not have the same depth. The second doped regions serve as source/drain (S/D) regions of the second transistor.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on the channel of the transistor to improve performance.

Metal silicide contacts 172 and 173 may be formed on the S/D regions and on the gate electrodes. The metal silicide contacts, for example, may be nickel-based contacts. Other types of metal silicide contacts may also be useful. For example, the metal silicide contact may be cobalt silicide (CoSi). The silicide contacts may be about 50-300 Å thick. Other thicknesses may also be useful. The metal silicide contacts may be employed to reduce contact resistance and facilitate contact to the back-end-of-line metal interconnects. For example, a dielectric layer (not shown) may be provided over the transistors. Via contacts, such as tungsten contacts, may be formed in the dielectric layer coupling the contact regions of the transistors to metal lines disposed in metal layers of the device.

The gain of the device is defined by the following equation:

$$\text{Gain} = G_m \times R_{out}$$

where $G_m$=transconductance; and $R_{out}$=output resistance.

We have found that, when there is a heavy halo doping in the channel, it alters the band bending and influences the threshold voltage of the transistor. As a result, channel length modulation, drain induced barrier lowering (DIBL) and static feedback are affected, lowering the gain of the device. As described, the second or HG transistor, unlike the first transistor, is not provided with LDD or halo regions. Thus, we have discovered that without LDD and/or halo regions, the gain of the second transistor and the device is improved.

Figure 2A:
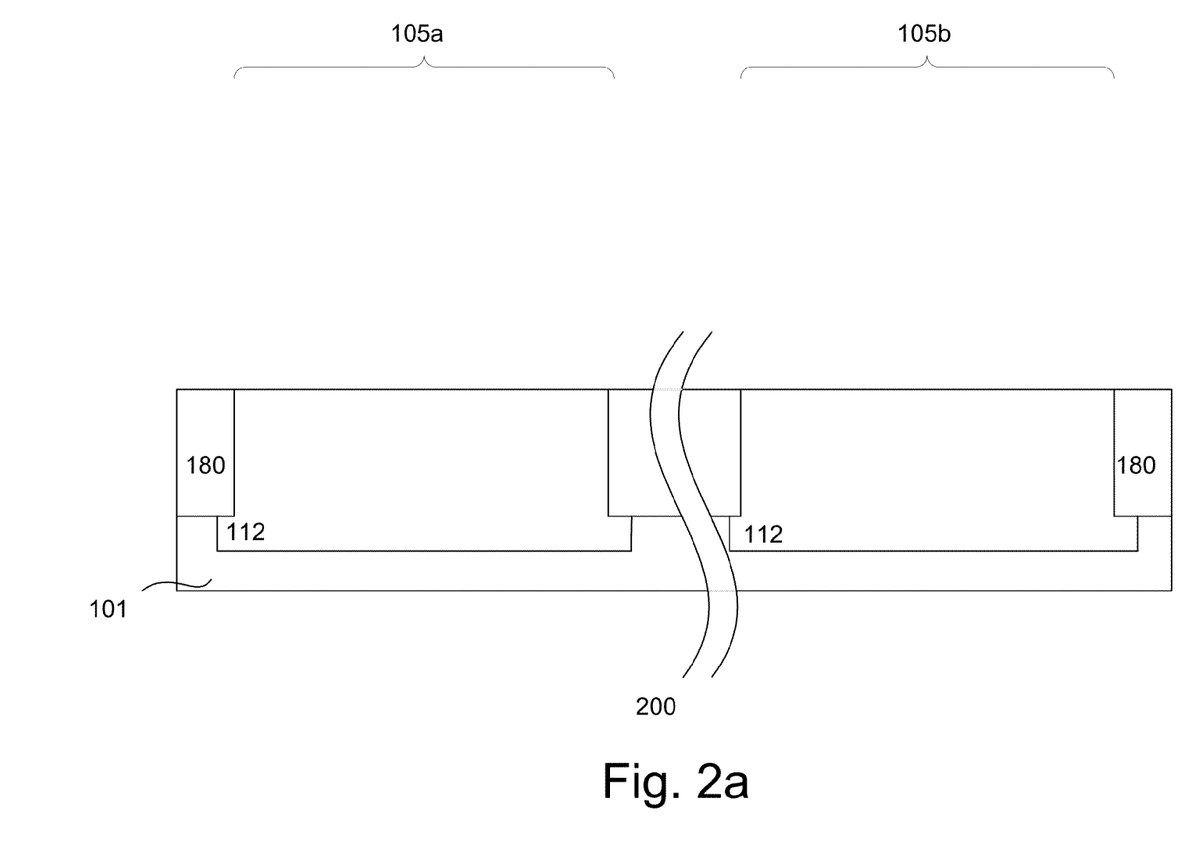
FIGS. 2a-f show cross-sectional views of an embodiment of a process for forming a device.

FIGS. 2*a-f* show cross-sectional views of an embodiment of a process 200 for forming a device. Referring to FIG. 2*a*, a substrate 101 is provided. The substrate, in one embodiment, is a silicon substrate. The substrate may be a doped substrate, such as a $p^-$ substrate. Other types of substrates, such as a germanium-based, gallium arsenide, COI such as SOI, or sapphire, may also be useful. The substrate may be doped with other types of dopants or dopant concentrations.

The substrate includes first and second device regions 105*a-b*. In one embodiment, the first device region is for a core or logic transistor and the second device region is for a high gain (HG) transistor. The substrate may also include regions for other types of circuitry, depending on the type of device or IC. For example, the device may also include regions for intermediate voltage (IV) and high voltage (HV) devices as well as an array region for memory devices.

The substrate is prepared with isolation regions 180 for isolating the device regions from other regions. For example, an isolation region surrounds a device region, isolating it from other device regions. The isolation regions, for example, are STI regions. Other types of isolation regions may also be useful. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STI regions may be, for example, about 2000-5000 Å. Other depths for the STI regions may also be useful.

The substrate is prepared with device wells 112 in the first and second device regions. The device wells may be formed by ion implantations. To form the device wells, an implant mask (not shown) which exposes the device regions is used. The implant mask, for example, is a photoresist layer patterned by a lithographic mask. The implant, for example, includes implanting second polarity type dopants into the substrate.

In one embodiment, the device wells are doped with second polarity type dopants. For example, the device wells are doped with p-type dopants. Alternatively, the second polarity type dopants may be n-type. The device wells serve as bodies of the transistors. For example, the device well in the first device region serves as a body of the first transistor and the device well in the second device region serves as a body of the second transistor. A depth of the device wells may be about 0.5-5 μm. Other depths for the device wells may also be useful. The dopant concentration of the device wells may be light to intermediate. For example, the dopant concentration of the device wells may be about 5E12-5E13/$cm^2$. Other dopant concentration for the device wells may also be useful.

Figure 2B:
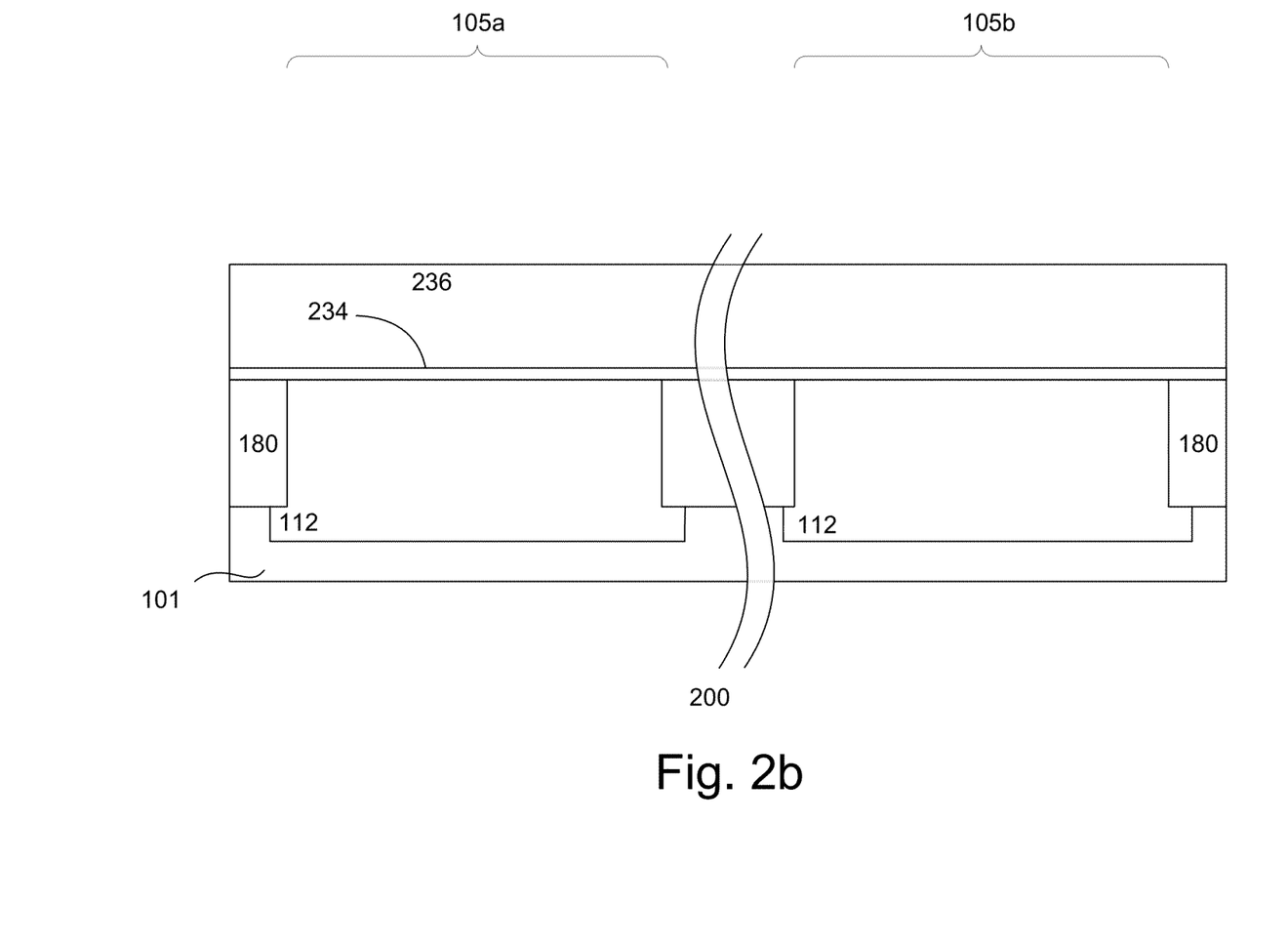

Referring to FIG. 2*b*, gate layers of the gates are formed on the substrate. In one embodiment, the gate layers include a gate dielectric layer 234 on the substrate and a gate electrode layer 236 formed thereon.

In one embodiment, the gate dielectric layer is silicon oxide. Other types of gate dielectric, for example, high k gate dielectric, may also be useful. The thickness of the gate dielectric layer may be about 10-40 Å. Other thicknesses may also be useful. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing can be, for example, performed at a temperature of about 600-1000° C. Forming other types of gate dielectric layers or using other processes may also be useful.

As shown, the thickness of the gate dielectrics for the transistors is the same. For example, the first transistor is a core transistor. In other embodiments, the transistors may have gate dielectrics of different thicknesses. For example, in the case where the first transistor is an IV or a HV transistor, the transistors may have different gate dielectric thicknesses.

In such cases, the substrate may be prepared to have different gate dielectric thicknesses in the first and second device regions.

As for the gate electrode layer, it may be a silicon layer. The silicon layer, for example, may be a polysilicon layer. The thickness of the gate electrode layer may be about 700-5000 Å. Other thickness may also be useful. The gate electrode layer may be formed by, for example, chemical vapor deposition. Other techniques for forming the gate electrode layer may also be useful. The gate electrode layer can be formed as an amorphous or non-amorphous layer. In the case of an amorphous layer, an anneal may be performed to form a polycrystalline silicon layer.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

Figure 2C:
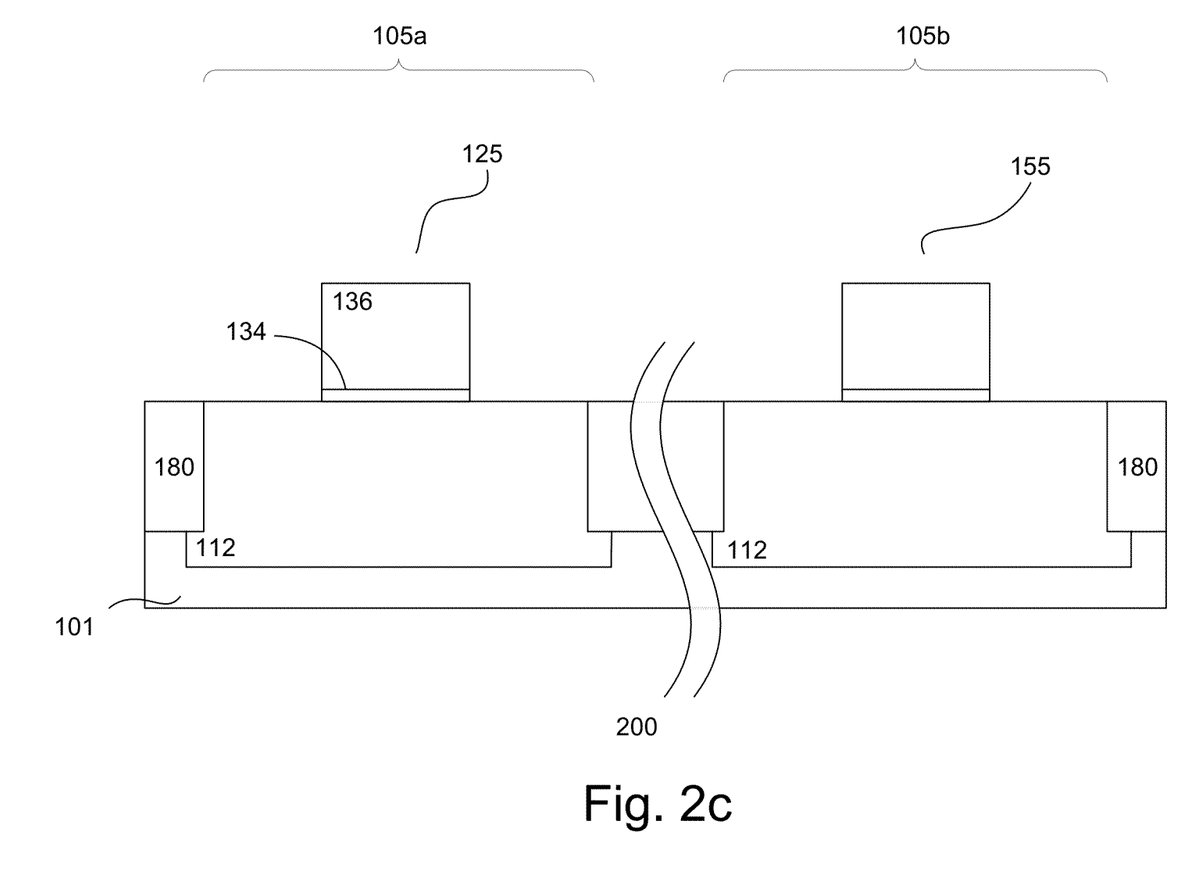

In FIG. 2c, the gate layers are patterned to form first and second gates 125 and 155 of first and second transistors. An etch mask may be employed to pattern the gate layers to form the gates. For example, a soft mask, such as a photoresist layer, may be used. An exposure source may selectively expose the photoresist layer through a reticle containing the desired pattern. After selectively exposing the photoresist layer, it is developed to form openings corresponding to locations when the gate layers are to be removed. To improve lithographic resolution, an anti-reflective coating (ARC) may be used below the photoresist layer.

In other embodiments, the mask layer may be a hard mask layer. The hard mask layer, for example, may include TEOS or silicon nitride. Other types of hard mask materials may also be used. The hard mask layer may be patterned using a soft mask, such as a photoresist.

An anisotropic etch, such as reactive ion etch (RIE) is performed using the etch mask to pattern the gate layers to form the gates. Other types of etch processes may also be useful. In one embodiment, an RIE is employed to pattern the gate layers to form the gates 125 and 155. The gates, for example, may be gate conductors which serve as common gates for multiple transistors. Other configurations of the gate may also be useful.

Figure 2D:
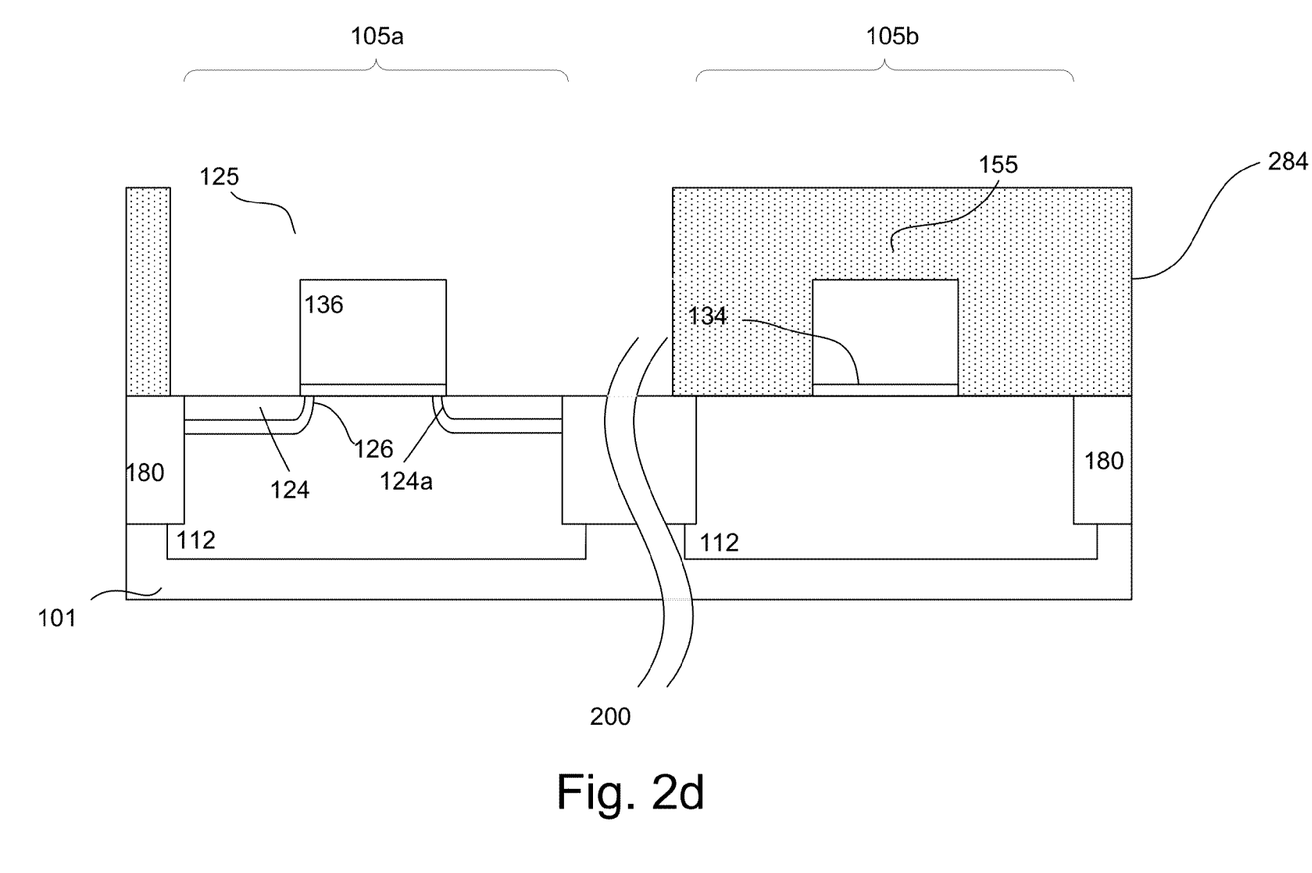

Referring to FIG. 2d, a mask 284 is formed on the substrate. The mask, for example, is a photoresist mask. Other types of masks may also be useful. The mask is patterned to form an opening in the first device region while protecting the second device region. The mask protects the second device region from subsequent processing.

An ion implantation is performed. The mask serves as an implant mask, preventing the second device region from the implant. In one embodiment, an implant is performed to form LDD regions 124 in the first device region. The implant, for example, is an angled implant. First polarity type dopants are implanted into the substrate to form the LDD regions 124.

The implant, for example, may be for the LDD regions in the substrate between the gate and isolation region in the first device region. For example, the implant may dope the substrate exposed by the implant mask between the first gate and the isolation region. The depth of the LDD regions, for example, may be about 0.05-0.3 µm. The implant dose may be about 5E13-5E15/cm² and the implant energy may be about 0.1-200 KeV. Other implant parameters may also be useful. As shown in FIG. 2d, inner edges 124a of the LDD regions adjacent to the sides of the gate are aligned with about sidewalls of the first gate 125. In one embodiment, the implant forms LDD regions which extend under the gate sidewalls. For example, the implant forms LDD regions which extend under the gate by about 0.004-0.04 µm. Providing LDD regions which extend under the gate by other distances may also be useful.

An implant is performed to form halo regions. The implant, for example, is an angled implant. For example, the implant is performed at about 20-45 degree with reference to the surface of the substrate. The halo region, for example, extends under the gate beyond the LDD regions. The halo regions, for example, extend under the gate beyond the LDD regions and above the first doped regions. The underlap portion may be, for example, about 0.002-0.02 µm. Providing an underlap portion which underlaps the gate by other amounts may also be useful. The depth of the halo regions, for example, may be about 0.07-0.4 µm. In one embodiment, the halo regions may be intermediate or heavily doped with second polarity dopants. The halo regions, for example, may have a dopant concentration of about 5E13-5E14/cm². Other dopant concentrations for the halo regions may also be useful. The halo regions, for example, have second polarity type dopants. The implant to form the halo regions may employ the same implant mask as the LDD regions. The implant to form the halo regions may be performed before or after the implant to form the LDD regions. After the LDD and halo regions are formed, the implant mask is removed. The implant mask may be removed by, for example, ashing. Other techniques for removing the implant mask may also be useful. An anneal, such as rapid thermal anneal (RTA), is performed after the implant to activate the dopants in the LDD and halo regions.

Figure 2E:
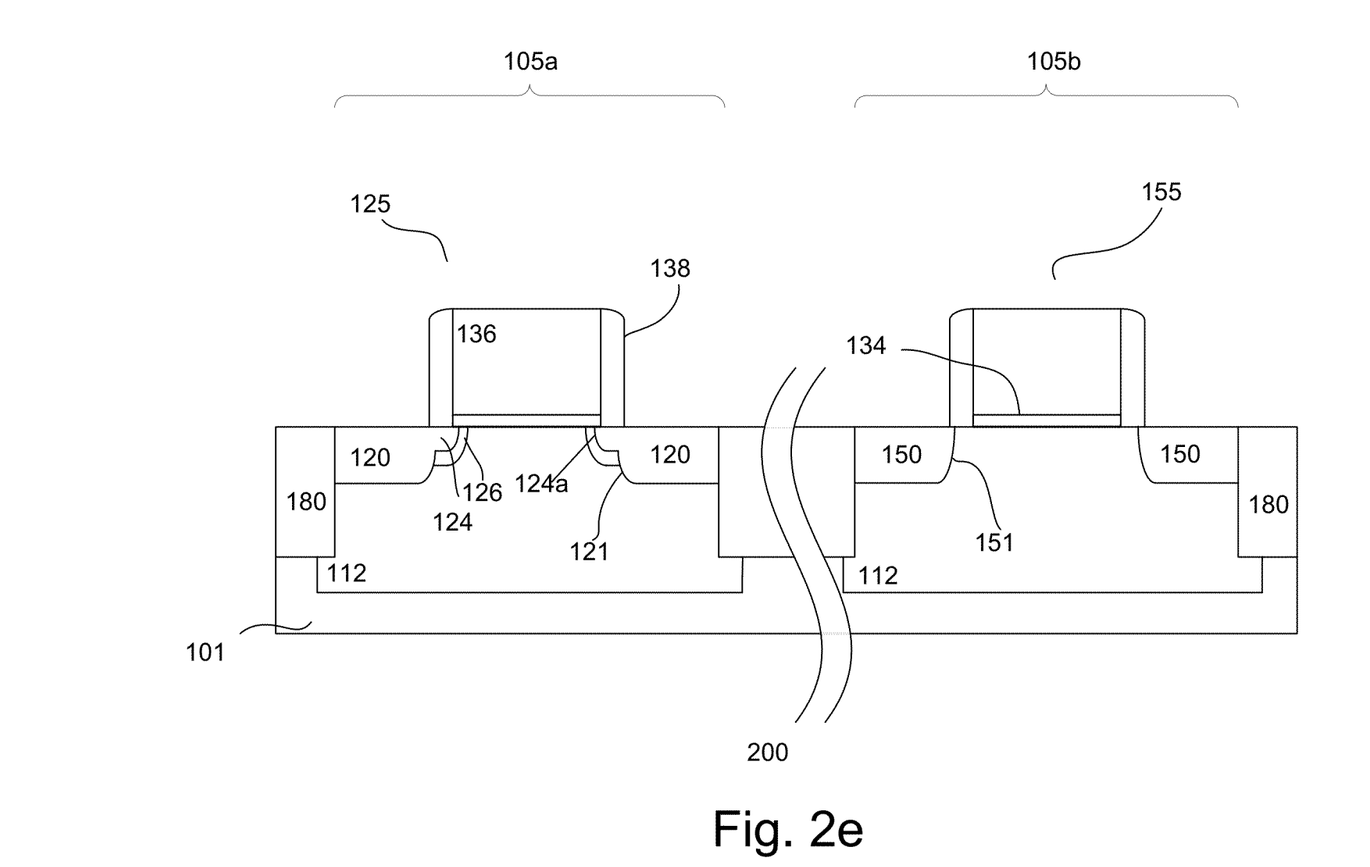

As shown in FIG. 2e, sidewall spacers 138 are formed on the sidewalls of the gates. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 100-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacers may be formed from multiple dielectric layers.

First and second doped regions 120 and 150 are formed in the substrate adjacent to the first and second gates. The doped regions are heavily doped regions having first polarity type dopants. An implant, for example, is performed using an implant mask, such as a photoresist mask, to form the first polarity type first and second doped regions in the first and second device regions. For example, the implant may dope the substrate exposed by the implant mask between the gate with the spacers and the isolation regions. The implant forms first and second heavily doped regions which have inner edges 121 and 151 that are aligned with about outer edges of the dielectric sidewall spacers of the first and second gate. The depth of the heavily doped regions, for example, is about 0.1-0.4 µm. The implant dose may be about 1E15-1E16/cm² and the implant energy may be about 10-100 KeV. Other implant parameters may also be useful. The doped regions serve as source/drain (S/D) regions of the transistors. An anneal, such as RTA, is performed after the implant to activate the dopants in the S/D regions. The inner edges of the doped regions, for example, may extend under the dielectric spacers due to diffusion of the dopants from the doped regions. The first and second doped regions, as described, are formed by the same implant. Forming the first and second doped regions by separate implant processes may also be useful.

After forming the S/D regions, the implant mask is removed. The implant mask may be removed by, for example, ashing. Other techniques for removing the implant mask may also be useful.

Figure 2F:
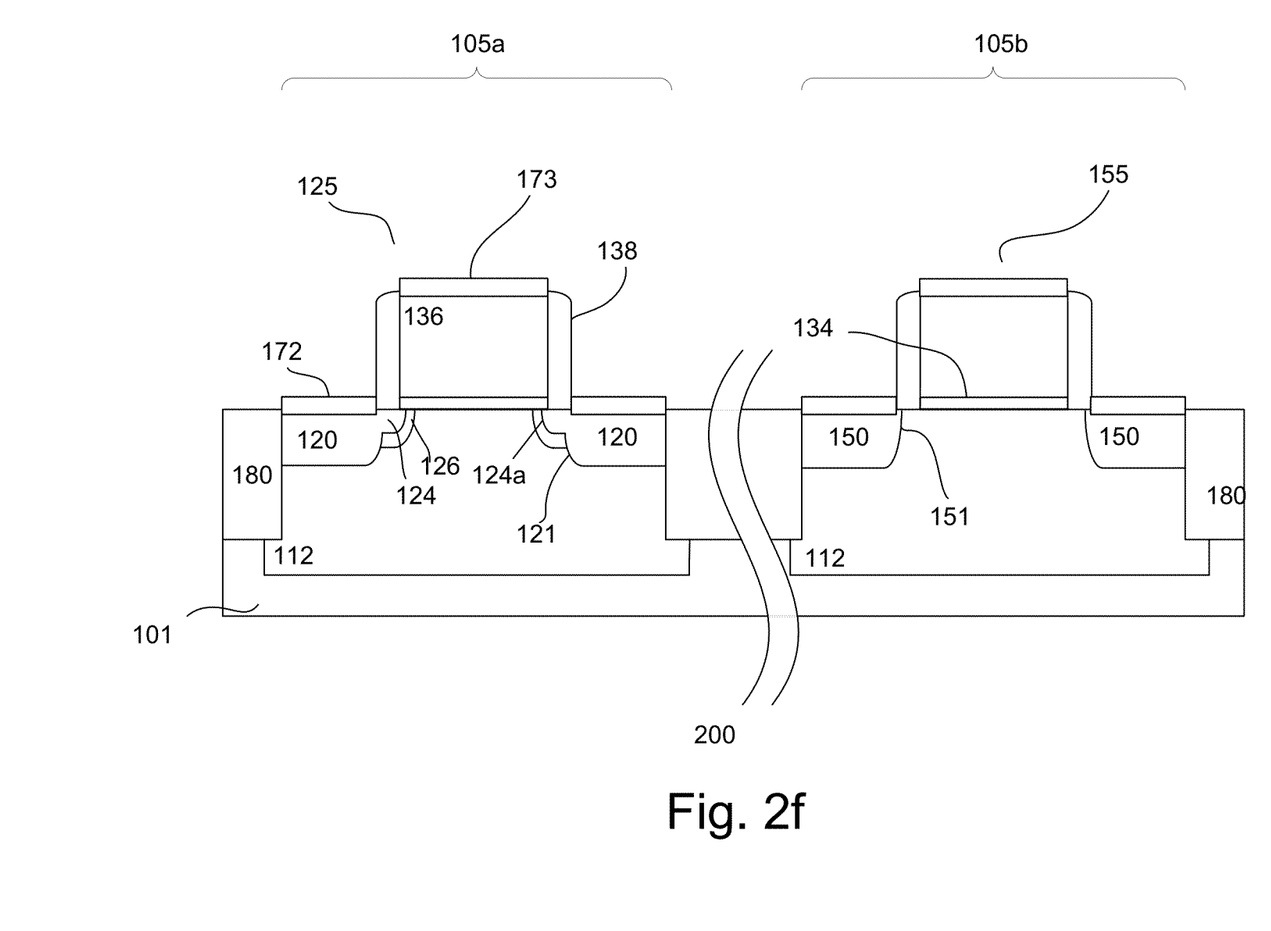

Referring to FIG. 2f, metal silicide contacts are formed on contact regions of the transistor. For example, the metal silicide contacts 172 and 173 are formed on the gates and S/D regions of the transistors. The metal silicide contacts, for example, are nickel based metal silicide contacts. Other types of metal silicide contacts may also be useful. The metal silicide contacts are used to facilitate low resistance contacts between the active substrate and the BEOL metal lines. In one embodiment, the thickness of the salicide contacts is about 50-300 Å. Providing other thicknesses may also be useful.

To form the silicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal layers and/or be formed by other types of processes can also be useful.

A anneal may be performed to cause a reaction between the metal and the substrate, forming a silicide layer. Excess metal not reacted in the silicidation of the active surface is removed by, for example, a wet removal process. For example, unreacted metal material is removed selective to the silicide contacts. Other techniques for forming the silicide contacts may also be useful.

The process continues to form the device. The processing may include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

The device formed by the process as described in FIGS. 2a-f, may include some or all advantages as described with respect to FIG. 1. As such, these advantages will not be described or described in detail. Moreover, the process as described does not require additional or extra mask compared with baseline processes. In addition, the device can be formed together with other baseline core devices.

Figure 3:
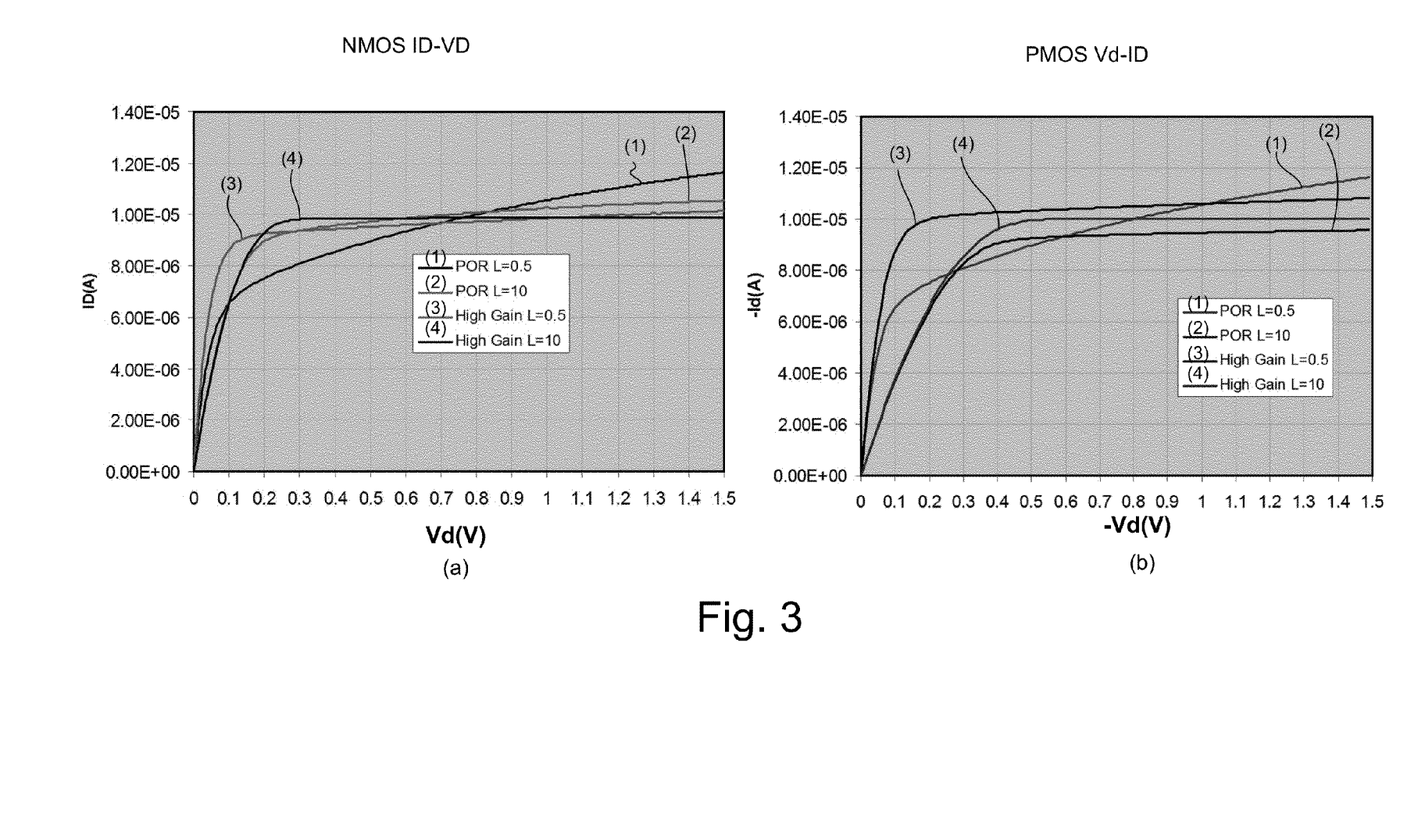
FIGS. 3a-b show graphs comparing the ID-VD plot for different NMOS and PMOS devices.

FIGS. 3a-b show ID-VD graphs of different NMOS and PMOS devices of, for example, the 0.13 μm technology node. The graphs plot drain current (ID) in amperes (A) versus drain voltage Vd in volts (V) of the devices. Lines 1 and 2 are devices having channel lengths of 0.5 μm and 10 μm, respectively, with LDD and halo regions; lines 3 and 4 are devices having channel lengths of 0.5 μm and 10 μm, respectively without LDD and halo regions. From the graphs, lines 1 and 2 show lower output resistance than lines 3 and 4. For example, transistors without LDD and halo regions exhibit much higher output resistance, and thus much higher gain than those with LDD and halo regions. The gains of the transistors are reflected in Tables 1a-b below:

TABLE 1a

| NMOS<br>ID = 10 μA<br>LP = 1.5 V | Gain LDD<br>and Halo | Gain No LDD<br>and no Halo |
|---|---|---|
| Channel Length = 0.5 μm | 45 | 236 |
| Channel Length = 10 μm | 57 | 1592 |

TABLE 1b

| PMOS<br>ID = 10 μA<br>LP = 1.5 V | Gain LDD<br>and Halo | Gain No LDD<br>and no Halo |
|---|---|---|
| Channel Length = 0.5 μm | 50 | 213 |
| Channel Length = 10 μm | 81 | 816 |

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate having a core device region and a high gain (HG) device region for a HG transistor;
forming a core gate on the substrate in the core device region and a HG gate on the substrate in the HG device region, wherein the HG gate includes sidewall spacers on its sidewalls, wherein
the core gate and HG gate include gate dielectric and gate electrode layers, and
the gate dielectric layers of the core gate and HG gate comprise the same thickness;
performing a lightly doped drain (LDD) implant, the LDD implant implants first polarity type dopants to form first polarity type LDD regions adjacent to the core gate, the first polarity type comprises n-type; and
performing a source/drain (S/D) implant, the S/D implant implants first polarity type dopants to form heavily doped first polarity type core S/D regions adjacent to the core gate and heavily doped first polarity type HG S/D regions adjacent to the HG gate, the core device region includes core S/D regions with LDD regions while the HG device region includes HG S/D regions without LDD regions.

2. The method of claim 1 wherein the HG transistor comprises a channel which is disposed under the HG gate and the channel length of the HG gate is at least about 0.5 μm.

3. The method of claim 1 comprising forming sidewall spacers on gate sidewalls of the core gate in the core device region.

4. The method of claim 1 comprising:
providing a mask having an opening exposing the core device region while covering the HG device region on the substrate; and
performing an implant to form second polarity type halo regions in the core device region.

5. The method of claim 1 comprising forming halo regions in the core device region.

6. A method of forming a device comprising:
providing a substrate having at least a first device region for a first transistor and a second device region for a second transistor, wherein the first and second device regions comprise first polarity type devices, the first polarity type comprises n-type, wherein the first transistor comprises a core transistor and the second transistor comprises a high gain (HG) transistor;
forming a first gate on the first device region and a second gate on the second device region, the gates include sidewall spacers on their sidewalls, wherein forming the first gate and the second gate comprises
  forming a gate dielectric layer on a top surface of the substrate and a gate electrode layer over the gate dielectric layer, and
  patterning the gate dielectric and gate electrode layers to form the first and second gates, wherein the gate dielectrics of the first and second gate comprise the same thickness;
forming first polarity type lightly doped drain (LDD) regions; and
performing a source/drain (S/D) implant to form first polarity type heavily doped S/D regions adjacent to the first and second gates, wherein the first device region includes first S/D regions with LDD regions while the second device region includes second S/D regions without LDD regions.

7. The method of claim 6 wherein the HG transistor comprises a channel which is disposed under the second gate and the channel length of the second gate is at least about 0.5 µm.

8. The method of claim 6 comprising:
providing a mask having an opening exposing the first device region while covering the second device region on the substrate; and
performing an implant to form the first polarity type LDD regions in the first device region.

9. The method of claim 8 wherein inner edges of the first polarity type LDD regions adjacent to sides of the first gate are aligned with about sidewalls of the first gate.

10. The method of claim 8 wherein the implant to form the first polarity type LDD regions comprises an angled implant and inner edges of the LDD regions extend under sidewalls of the first gate.

11. The method of claim 8 comprising:
performing an implant to form second polarity type halo regions in the first device region.

12. The method of claim 11 wherein the implant to form the second polarity type halo regions is performed before the implant to form the first polarity type LDD regions.

13. A method of forming a device comprising:
providing a substrate having a core device region for a core transistor and a high gain (HG) device region for a HG transistor, wherein the core and HG device regions comprise first polarity type devices which is n-type;
forming a core gate on the substrate in the core device region and a HG gate on the substrate in the HG device region, wherein the core gate and the HG gate include sidewall spacers on their sidewalls, wherein
  the core gate and HG gate include gate dielectric and gate electrode layers, and
  the gate dielectric layers of the core gate and HG gate comprise the same thickness;
forming first polarity type lightly doped drain (LDD) regions only in the core device region, wherein inner edges of the LDD regions are aligned with about sidewalls of the core gate; and
performing a source/drain (S/D) implant to form first polarity type heavily doped S/D regions adjacent to the core and HG gates, the core device region includes core S/D regions with LDD regions while the HG device region includes HG S/D regions without LDD regions.

14. A method of forming a device comprising:
providing a substrate having a core device region for a core transistor and a high gain (HG) device region for a HG transistor;
forming a gate on the substrate in the core device region and a HG gate on the substrate in the HG device region, wherein
  the gate and the HG gate include sidewall spacers on their sidewalls, and
  the core transistor comprises a channel length which is less than about 0.18 µm and the HG transistor comprises a channel length which is at least about 0.5 µm; and
forming lightly doped drain (LDD) regions only in the core device region, wherein inner edges of the LDD regions are aligned with about sidewalls of the gate.

15. The method of claim 13 wherein forming the first polarity type LDD regions comprises:
providing a mask having an opening exposing the core device region while covering the HG device region on the substrate; and
performing an implant to form the first polarity type LDD regions only in the core device region.

16. The method of claim 15 wherein inner edges of the heavily doped regions are aligned with about outer edges of the sidewall spacers of the gates.

* * * * *